(12) United States Patent
Roy

(10) Patent No.: US 6,387,770 B2
(45) Date of Patent: May 14, 2002

(54) THIN-FILM CAPACITORS AND METHODS FOR FORMING THE SAME

(75) Inventor: Arjun Kar Roy, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/772,726

(22) Filed: Jan. 30, 2001

Related U.S. Application Data

(62) Division of application No. 09/241,728, filed on Feb. 2, 1999, now Pat. No. 6,180,976.

(51) Int. Cl.[7] ..................... H01L 21/20; H01L 21/4763
(52) U.S. Cl. ................. 438/384; 438/633; 257/532
(58) Field of Search ....................... 257/532–535, 257/301–306; 438/381, 384–386, 622, 626, 631–633

(56) References Cited

U.S. PATENT DOCUMENTS 5,708,559 A * 1/1998 Brabazon et al. ........... 361/313
5,773,871 A * 6/1998 Boyd et al. ................. 257/532
6,150,707 A * 11/2000 Cook et al. ................. 257/535

* cited by examiner

*Primary Examiner*—Matthew Smith
*Assistant Examiner*—Calvin Lee
(74) *Attorney, Agent, or Firm*—Thomas, Kayden, Horstemeyer & Risley, LLP

(57) ABSTRACT

An improved thin-film capacitor and methods for forming the same on a surface of a substrate are disclosed. The capacitor includes a bottom conducting plate formed by depositing conductive material within a trench of an insulating layer and planarizing the conducting and insulating layers. A dielectric film is then deposited on the substrate surface, such that at least a portion of the dielectric material remains over the bottom conducting plate. A second conductive layer is then deposited over the surface of the substrate, patterned and etched such that at least a portion of the second conducting material resides over at least a portion of the dielectric material.

13 Claims, 5 Drawing Sheets

US 6,387,770 B2

THIN-FILM CAPACITORS AND METHODS FOR FORMING THE SAME

This application is a division of Ser. No. 09/241,728 filed Feb. 2, 1999, now U.S. Pat. No. 6,180,976.

FIELD OF THE INVENTION

The present invention relates generally to capacitors in microelectronic devices. More particularly, the present invention relates thin-film capacitors and methods for forming the same.

BACKGROUND OF THE INVENTION

Formation of predictable and reliable capacitors in microelectronic devices may be desirable for several reasons. For example, mixed signal, radio frequency, and other circuits or devices may desirably include integrated capacitors with predictable and reliable electrical characteristics. Moreover, these devices often preferably include capacitors with low voltage coefficients (change of capacitance with voltage over an operating voltage range), good capacitor matching, and relatively predictable capacitor values. If capacitors form part of an integrated circuit, it may also be desirable to minimize additional processes or changes to processes required to form the capacitor. In other words, it is desirable to reduce the number of processes that are capacitor formation specific. Accordingly, it is often desirable to form such capacitors using substantially standard semiconductor process flows such as CMOS, bipolar, and BiCMOS processes.

Capacitors for microelectronic devices and the like may be formed in a variety of configurations. Often, such capacitors may be in the form of a thin-film capacitor and include two substantially parallel layers of conductive material separated by an insulating layer. Conductive materials typically include doped silicon substrate, polysilicon, or metal; insulating materials typically include a dielectric material such as silicon oxide, silicon nitride, silicon oxynitride, tantalum oxide, barium strontium titanate, or other insulating materials.

The thin-film capacitor is generally formed by depositing, patterning, and etching various layers on a substrate. Typically, a first parallel layer of conductive material (a base plate) is formed by depositing the conductive material over the surface of the substrate, wherein the substrate may be a semiconductor wafer with several layers of conducting, insulating, semiconducting and semi-insulating layers thereon. Alternatively, the conductive material may be formed by doping the semiconductor substrate or another layer with substantially conductive material.

If the base plate is formed by depositing conductive material on the wafer surface, the material may be patterned with photoresist and etched using an appropriate wet or dry etch process. Similarly, and regardless of how the base plate was formed, the insulating layer may be formed by depositing insulating material over the surface of the wafer, patterning the insulating material, and etching the insulating material leaving at least some insulating material over at least a portion of the conducting layer. A second conducting plate (top plate of the capacitor) may be formed over the insulating layer in a like manner.

Typical capacitor materials and configurations of top and base capacitor plates known in the art generally include: a polysilicon top plate and a doped substrate base plate, a polysilicon top plate and a polysilicon base plate, a metal top plate and a polysilicon base plate, a metal top plate and a doped substrate plate, and a metal top plate and a metal base plate. Of these various capacitor configurations, the metal-to-metal capacitors, which have relatively low plate sheet resistance, may be particularly advantageous because, among other reasons, the capacitor generally has reduced parasitic capacitance because it allows for increased distance between the metal layers and the substrate (i.e., the base plate may be formed above the substrate surface). The metal-to-metal capacitors also generally have lower voltage coefficients due to reduced voltage induced depletion effects at the metal-to-insulator interface. In addition, because the metal plates of the capacitors have relatively low sheet resistance, the capacitors have relatively low series resistance, which allows capacitors with high a large Q factor to be constructed on the surface of a substrate. Capacitors with large Q factors may be particularly beneficial for use in RF circuits.

In an effort to reduce device and circuit costs, it is generally preferred to reduce the size of the devices and circuits and their corresponding capacitors. Capacitor size, for a given capacitance, may be reduced by increasing the capacitor's capacitance density. The increase in capacitance density can be achieved by using insulating layers with higher dielectric constant, by reducing the thickness of the insulating layer (i.e., the distance between the top and base plate of the capacitor), or a combination thereof.

The preferred distance between conducting layers for a given dielectric material is often governed by voltage breakdown design parameters, and the breakdown voltage parameters are generally dependent upon, among other things, the minimum distance between conducting layers. If either the insulating layer or the conducting layers, or a combination thereof have rough surfaces, the insulating layer thickness may have to be increased to compensate for the thinner regions of the layer such that the thinnest portion of the insulating layer provides adequate (e.g., sufficiently high) breakdown voltage characteristics.

One method of smoothing a surface of the insulating or conducting layer is to use chemical mechanical planarization (CMP), also known as chemical mechanical polishing. A capacitor formed by using CMP to form the top and bottom plates of a capacitor is disclosed in U.S. Pat. No. 5,708,559, issued to Brabazon et al. on Jan. 13, 1998. The '559 patent discloses methods of forming a capacitor on a surface of a wafer by forming a trench in an insulation layer, depositing metal over the insulation layer and planarizing the surface of the wafer to form the bottom plate of the capacitor. A thin layer dielectric is then deposited and patterned over the first capacitor plate, and this layer is patterned and etched such that a portion of the first metal plate of the capacitor is exposed. A second insulator is then deposited on the wafer surface and openings are etched into the second insulating material. A second metal layer is then deposited on top of the insulating layer, filling the openings, thereby forming a contact to the first and second plates of the capacitor.

While the '559 patent discloses methods for forming thin-film, metal-insulator-metal capacitors on a surface of a wafer, the disclosed processes generally include either excess or additional photoresist masking steps to form the capacitor plates, which may increase overall wafer fabrication costs, or the methods include etch stops on a part of the dielectric that communicates with the top capacitor plate. Use of such etch stops may cause variation of capacitance values due to capacitor formation processing and the like. In addition, the disclosed methods generally require etching through thick insulating layers to define the capacitor area. Etching of these thick layers typically results in increased variation of the trench dimensions that define the plate dimensions. This variation may in turn cause increased variation in the electrical properties of the capacitor such as capacitor matching. In addition, the processes disclosed in the '559 patent may include additional processing steps to form electrical contacts to the bottom metal plate capacitor. Simplified, cost-effective, and well defined capacitor flows are therefore desirable. In addition, capacitor formation processes that allow for capacitor formation at various levels or layers on a substrate may be desirable.

Capacitor characteristics, including capacitor reliability, may also depend on the integrity of the capacitor perimeter (e.g., the perimeter of the base plate, insulator, top plate, or a combination thereof). Prior-art capacitor formation processes typically expose the perimeter of the capacitor, particularly the perimeter of the dielectric material, to subsequent semiconductor processing steps such as interlayer dielectric deposition, etch, and the like. Such exposure may degrade the capacitor characteristics or render the characteristics unpredictable. Accordingly, methods of forming the capacitor that protect the capacitor perimeter during the formation are desirable.

SUMMARY OF THE INVENTION

The present invention provides improved thin-film capacitors and methods for forming the same. While the way in which the present invention addresses the various disadvantages of presently known capacitors will be addressed hereinbelow, in general, the invention provides a capacitor that is formed during formation of other microelectronic devices with relatively few additional processing steps. In addition, the capacitor formation processing steps are preferably configured to allow for improved capacitor characteristics control and to form robust, reliable capacitors.

In accordance with an exemplary embodiment of the present invention, a spacer is formed around a capacitor plate perimeter to reduce process-induced damage to the perimeter of the capacitor dielectric and to the dielectric-to-plate interface.

In accordance with another exemplary embodiment of the present invention, a capacitor plate is formed by forming a trench in a first insulating material. Conducting material is then deposited over the surface of the wafer, filling the trench. The conducting material is then planarized to produce a plate of the capacitor within the trench; a second insulating material is then deposited over the surface of the wafer to form the capacitor dielectric. Next, the top plate of the capacitor is formed by depositing conducting material over the surface of the wafer and patterning and etching the conducting material to form the top plate and define the capacitor area.

In accordance with a further exemplary embodiment of the present invention, a capacitor plate and conductive plugs are formed in a first insulating material. The capacitor and conductive plugs are formed by etching trenches and vias in the first insulating material and depositing conducting material over a surface including trenches and vias. The conductive material is then planarized to produce the base plate of the capacitor in the trenches and conductive plugs in the vias. A second insulating material, the capacitor dielectric, is then deposited over the surface of the wafer. Next, the top plate of the capacitor is formed by depositing conductive material over the surface of the wafer and patterning and etching this layer to form the capacitor top plate. In accordance with an exemplary aspect of this embodiment, a conductive feature may simultaneously be formed during the top plate formation. Another dielectric thin film is then deposited onto the wafer surface and then etched back to form a sidewall spacer along the perimeter of the capacitor top plate to protect the capacitor perimeter during subsequent processing steps. In accordance with a further aspect of the invention, films such as insulating materials are deposited as an interlevel dielectric to the next conductive layer. Vias and trenches are then formed within the interlevel dielectric material and conductive material is deposited and planarized using single or dual damascene processes to form electrical connections to underlying layers.

In accordance with a further exemplary embodiment of the present invention, the capacitor insulating material and top plate overhang the base plate. The overhang of the insulating material and top plate allow etch steps which are less selective with respect to the top conductive layer and various insulating materials to be used during capacitor formation.

In accordance with another embodiment of the present invention, electrical contacts to the capacitor top plate are formed in the overhang region to allow use of less selective etches with respect to the top plate material during top plate contact formation.

In accordance with another exemplary embodiment of the present invention, the top plate of the capacitor may be offset from the base plate of the capacitor, allowing various electrical connections to the top and base plates to be made from either the top or bottom of the respective plate.

In accordance with another exemplary embodiment of the present invention, the capacitor dielectric and the top plate of the capacitor may overhang the base plate. In addition, the top plate of the capacitor may be formed in the top most metallization level. This allows increased distance between the substrate and the capacitor, which provides reduced parasitic capacitance to the substrate.

In accordance with another exemplary embodiment of the present invention, the capacitor may be formed near the substrate surface (e.g., in the first metallization level). This allows refractory metals to be used to form the base plate of the capacitor, which in turn allows for high temperature processing such as dielectric material anneals subsequent to base plate formation.

In accordance with another exemplary embodiment of the present invention, a capacitor base plate and conductive plug are formed in a first insulating material by etching a trench and via within the first insulating material. In accordance with a further aspect of the present invention, the via and trench are formed using separate patterning steps such that the trench is relatively shallow and the via extends through the first insulating material. The capacitor base plate and conductive plugs are subsequently formed by depositing conductive material over the surface of the first insulating material. The conductive material is then planarized to produce the base plate of the capacitor and conductive plugs in the vias. A second insulating material, the capacitor dielectric, is then deposited over the surface of the wafer. Next, the dielectric is patterned and etched to form structures having a positive overhang with respect to the base plate and removed from areas away from the structures. The top plate of the capacitor is then formed by depositing conductive material over the surface of the wafer and patterning and etching this layer to form the capacitor top plate. In accordance with an exemplary aspect of this embodiment, conductive features such as metal lines are formed during top capacitor plate formation. In accordance with yet a further aspect of this embodiment, other films such as insulating materials are deposited as an interlevel dielectric to the next conductive layer. Vias are then formed within the interlevel dielectric material and metal is deposited, patterned and etched to form the electrical connections to the capacitor and other conductive features.

BRIEF DESCRIPTION OF THE DRAWINGS

A more complete understanding of the present invention may be derived by referring to the detailed description and claims when considered in connection with the drawing figures, wherein like reference numbers refer to similar elements throughout the figures, and:

DETAILED DESCRIPTION OF PREFERRED EMBODIMENTS

The present invention generally relates to capacitors formed on a substrate surface and to methods for forming the capacitors. More particularly, the invention relates to forming thin-film capacitors on a substrate surface using chemical mechanical planarization (CMP). While the thin-film capacitors of the present invention may be formed on the surface of any substrate, the present invention is conveniently described in connection with the surface of a semiconductor wafer, wherein the wafer may have several layers of conducting, insulating, semi-conducting and semi-insulating layers deposited and patterned thereon. Further, during formation of the capacitor or other microelectronic devices on a semiconductor surface, the surface of the wafer may change from step to step in the fabrication process. Therefore, as used below, the term surface generally means the top of the semiconductor wafer, and may not necessarily refer to any particular film or device structure.

Figure 1:
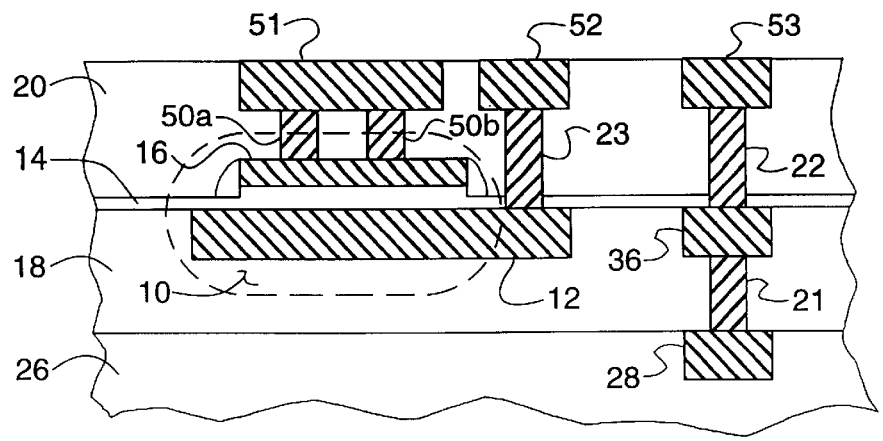
FIG. 1 is a schematic cross-sectional diagram of a semiconductor wafer including a thin-film capacitor in accordance with the present invention.

A thin-film capacitor 10 in accordance with the present invention is shown in FIG. 1. Thin-film capacitor 10 generally includes a base plate 12, a dielectric layer 14 and a top plate 16. Thin-film capacitor 10 is typically surrounded by insulating layers 18 and 20 and conductive plugs 21, 22, 23, 50a and 50b are typically used to form electrical contacts to various components on the wafer.

In accordance with various embodiments of the present invention, methods of forming capacitor 10 and other features on the wafer preferably require few additional steps (e.g., deposition, masking, and etching steps) that are specific to capacitor 10 formation. In addition, preferable embodiments are generally configured such that capacitor 10 may be formed at various metallization levels. Accordingly, the preferred capacitors and methods described below are designed to be robust such that they may be formed or implemented at various metallization levels on the wafer surface.

With reference to FIGS. 2–8, thin-film capacitor 10 may be formed on a surface 24 of a semiconductor wafer. Surface 24 may include any material and preferably includes an insulating film 26 and a conductive feature 28. Insulating film 26 may include any material that is resistant to the conduction of electricity. Such materials may include doped or undoped silicon oxide, phosphosilicate glass, tetraethylorthosilane (undoped or doped with boron and/or phosphorous), low-k dielectric materials such as spin on dielectrics, fluorinated oxides, or the like. Conductive feature 28 may include any material capable of conducting electricity such as, for example, polysilicon, doped polysilicon, tungsten, aluminum, copper, titanium nitride, any combination thereof, or the like.

In exemplary aspects of this embodiment of the present invention, base plate 12 is formed within insulating layer 18 using damascene processing, which includes forming a trench within the insulating material, filling the trench with material, and removing any excess material from the surface by CMP or other planarizing processes. Accordingly, capacitor 10 formation generally begins with depositing insulating layer 18 onto surface 24 of the wafer. Insulating material 18 may include any material that is resistant to conduction of electricity. Preferably, insulating material 18 includes an oxide, a doped oxide, a low-k dielectric material, any combinations thereof, or the like. For example, insulating material 18 may include silicon oxide. Insulating material 18 is preferably planarized using CMP to provide a smooth surface for subsequent processing. As discussed in greater detail hereinbelow, planarizing a surface such as the surface of material 18 may facilitate relatively precise transfer of a photoresist pattern onto a surface, which allows for relatively predictable capacitor performance.

Figure 2:
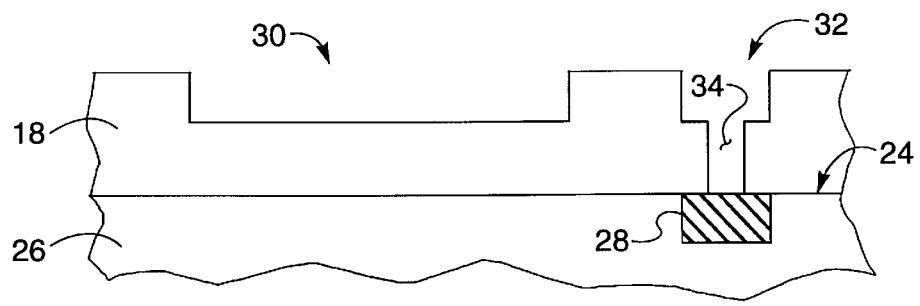
FIG. 2 is a schematic cross-sectional diagram of a wafer showing a trench and a via formed within an insulating layer.

Referring now to FIG. 2, insulating layer 18 may be patterned and etched to form trenches 30, 32 and a via 34. Trenches 30, 32 and via 34 may be formed by any methods now known in the art or hereafter devised. For example, trenches 30, 32 may be formed by patterning the surface of material 18 with an etch-resistant substance and exposing portions of material 18 to an etchant. In accordance with various aspects of the present invention, trenches 30, 32 and via 34 may be formed with the same (damascene processing) or distinct masking and etching steps (dual damascene processing). If the damascene process is employed, no additional device fabrication steps that are specific to capacitor 10 formation are required to form base plate 12 of capacitor 10.

Figure 3:
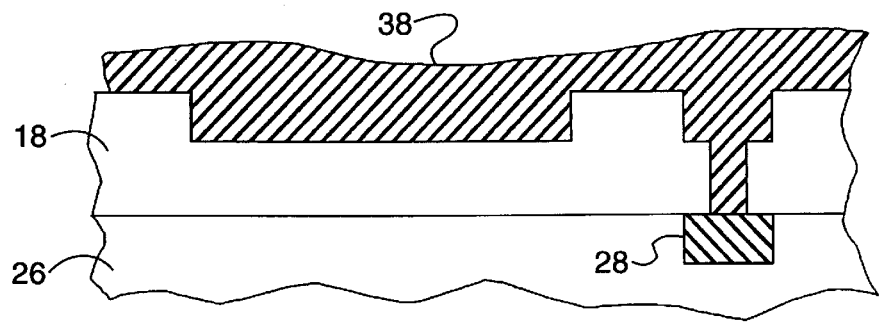
FIG. 3 is a schematic cross-sectional diagram of the wafer shown in FIG. 2 with conductive material deposited over the surface of the wafer.

Referring particularly to FIG. 3, base plate 12 of capacitor 10 and conductive features such as line 36 and plug 21 may be formed by depositing a conducting material 38 over the surface of insulating layer 18. Conducting material 38 may include any material that allows conduction of electricity. In exemplary embodiments of the present invention, conducting materials may include metals such as copper, tungsten, aluminum, or titanium nitride. In particularly preferred embodiments of the present invention, conducting material 38 includes a barrier metal of about 0 to about 800 Å of titanium nitride, titanium, tantalum, tantalum nitride, combinations thereof, or the like and about 1000 to about 10,000 Å of copper, aluminum, or tungsten. In accordance with various aspects of this embodiment, plate 12 may be formed in a first or relatively low metallization level. In this case, the substrate may be exposed to high temperature processing subsequent to plate 12 formation. For example, the substrate may be exposed to a thermal process such as a rapid thermal anneal at temperatures up to about 600° C. in an oxygen, nitrogen, hydrogen, or the like atmosphere. The thermal treatment may help reduce charge traps within the dielectric, reduce current leakage in the device, and increase the breakdown voltage of the device.

Figure 4:
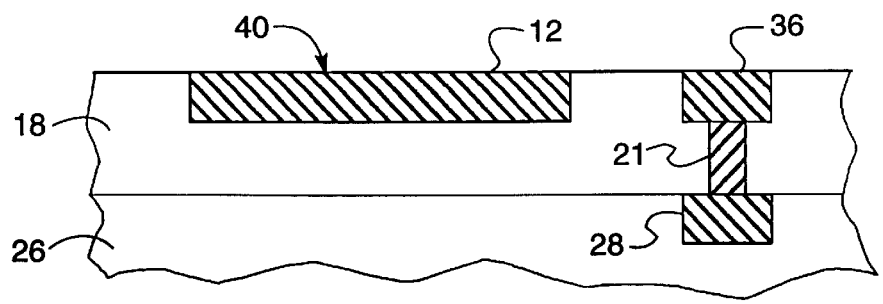
FIG. 4 is a schematic cross-sectional diagram of the wafer shown in FIG. 3 after the conductive material has been planarized.

Referring now to FIG. 4, base plate 12 and line 36 are defined by removing a portion of conducting material 38 such that the top of conducting material 38 is substantially in the same plane as the top of insulating layer 18. Preferably, the portion of conducting material 38 is removed using CMP. Using CMP to remove a portion of conducting material 38 is advantageous for capacitor formation because, among other reasons, it provides a smooth top and planarized surface 40 of base plate 12 for improved capacitor 10 performance. If base plate 12 includes a smooth surface, a thinner insulating layer between base plate 12 and top plate 16 may be used without jeopardizing capacitor performance.

In accordance with a preferred aspect of this embodiment, base plate 12 may be conditioned to prevent dielectric layer-conducting layer interface degradation. Conditioning techniques may include a sputter clean, passivation anneals in atmospheres of oxygen, nitrogen, hydrogen, other gases, and combinations thereof. In addition, a thin barrier layer (not shown) having a thickness of about 50 to about 500 Å may be deposited onto surface 40. In this case, additional masking and etching steps may consequently be necessary to remove the barrier layer form the surface of material 18 to prevent shorts between base plate 12 and line 36 and the like.

Figure 5:
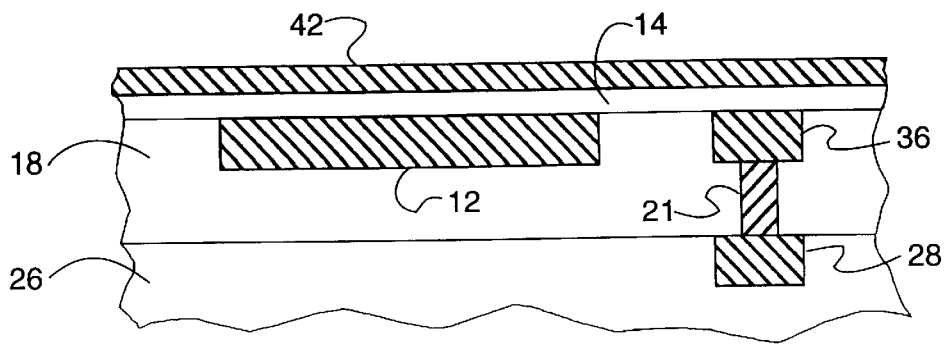
FIG. 5 is a schematic cross-sectional representation of the wafer shown in FIG. 4 with a dielectric film and a conductive material deposited on the wafer surface.

Referring now to FIG. 5, an insulating material such as dielectric layer 14 of capacitor 10 may be formed by depositing a dielectric material over the entire surface of the wafer. Dielectric layer 14 may be formed using any material that is partially or wholly resistant to the conduction of electricity. Preferably, material used to form dielectric layer 14 also has a high dielectric constant. Such materials preferably include silicon oxides, silicon nitrides, silicon oxynitrides, tantalum oxide, barium strontium titanate, or the like. The particular thickness of dielectric layer 14 may depend on a particular application of capacitor 10, upon desired capacitor characteristics, and the like. However, in a particularly preferred embodiment of the present invention, dielectric layer 14 is approximately 50 to about 1000 Å thick.

With continued reference to FIG. 5, a conductive material 42 is deposited over the surface of dielectric layer 14. In particularly preferred embodiments of the present invention, conductive material 42 includes films comprising: titanium nitride, titanium nitride/titanium, titanium nitride/titanium/ titanium nitride, titanium nitride/tungsten, tantalum nitride/ copper, combinations thereof and the like, with thicknesses ranging from about 800 to about 3000 Å.

In accordance with an exemplary embodiment of the present invention, top plate 16 formation includes patterning a substantially planar surface. Patterning over a planar surface (i.e., a surface that is substantially devoid of topography) allows relatively true pattern translation. In particular, during capacitor top plate 16 formation, the photoresist pattern can be substantially accurately transferred to material 42 for relatively accurate definition of top plate 16, particularly if material 42 is sufficiently thin, for example, less than about 2000 Å. Sufficiently thin top plate 16 may also result in reduced localized etch profile variations, such as, for example, reactive ion etching lag, pattern dependent profile microloading, and the like, as well as reduced across-wafer material 14 film-thickness variations due to material 42 etch and over etch processes. This patterning over the substantially planar surface may also increase capacitor matching.

Capacitor matching is a comparison of the capacitance values and electrical properties of two or more identically or similarly designed capacitors. Good capacitor matching typically indicates good circuit and capacitor performance. Generally, capacitors that are compared are placed close to each other on a substrate in a symmetric manner; this layout allows precise measurement of the capacitor matching and reduces minimizing process variation contributions to differences in the respective capacitor properties. Good capacitor matching is particularly important for RF and mixed signal devices.

Figure 6:
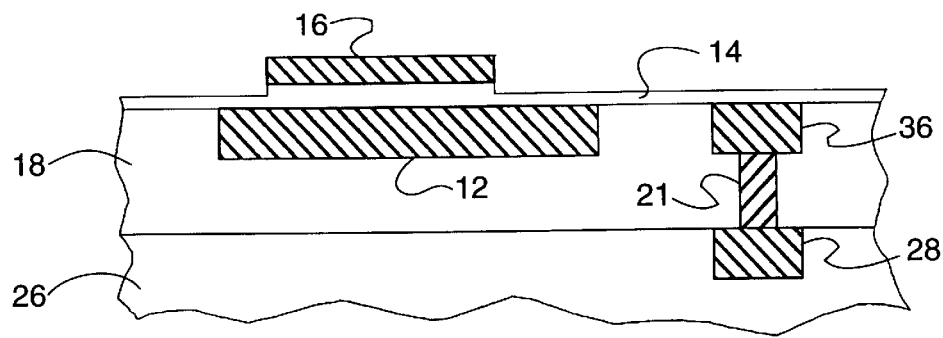
FIG. 6 is a schematic cross-sectional diagram of the wafer shown in FIG. 5 with a top plate of a capacitor formed on the surface of the wafer.

With reference now to FIG. 6, top plate 16 of capacitor 10 may be formed over dielectric layer 14 in a variety of ways. Preferably, top plate 16 is formed by coating material 42 with photoresist, patterning the photoresist, developing the photoresist, and etching material 42 to form top plate 16. In accordance with various aspects of this embodiment of the present invention, dielectric material 14 acts as an etch stop layer for material 42 etch such that material 42 etchants do not react with material 18 and the like.

Figure 7:
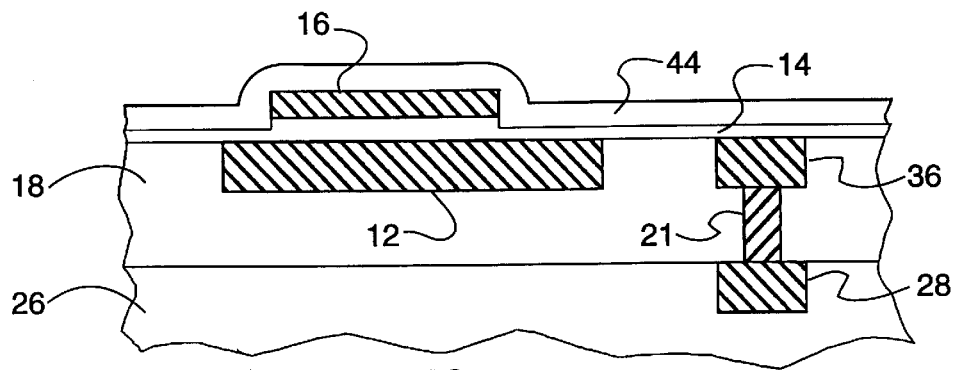
FIG. 7 is a schematic cross-sectional diagram of the wafer shown in FIG. 6 with a second dielectric film deposited on top of the wafer.
Figure 8:
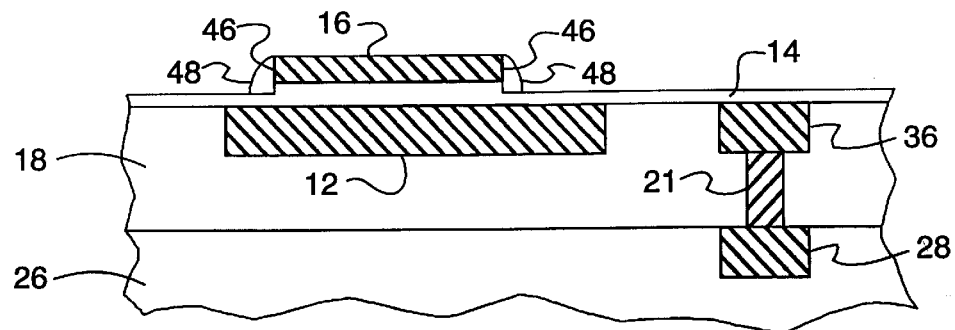
FIG. 8 is schematic cross-sectional diagram of the wafer shown in FIG. 7 with the second dielectric film etched back to form sidewall spacers along the perimeter of the capacitor.

With reference now to FIGS. 7 and 8, a spacer 48 may be formed about the perimeter of top plate 16 to, among other things, protect the perimeter of the interface between dielectric 14 and top plate 16 and of dielectric 14 from potential chemical attack or degradation during subsequent wafer processing. Spacer 48 is preferably configured to minimize potential interaction between capacitor 10 materials and other materials on the wafer surface, to reduce defect density at the perimeter of capacitor 10, and improve capacitor 10 reliability and matching.

Spacer 48 is preferably formed by depositing an insulating material 44 onto the wafer surface. Material 44 may include silicon oxide, silicon nitride, the same material as dielectric 14, or combinations thereof. Material 44 may be deposited using chemical vapor deposition, spin-on techniques, and the like. Preferably, about 500 to about 3000 Å of material 44 is deposited onto the wafer surface. In accordance with exemplary embodiments, the thickness of the material 44 is preferably greater than or equal to the thickness of the dielectric 14. Spacer 48 may be defined by removing material 44 from all parts of the wafer except near sidewall 46 of plate 16. This may be done, for example, by using an anisotropic dry etch process.

Any number of conducting, semi-conducting, semi-insulating or insulating films may be added to the surface of the wafer after capacitor 10 is formed. For example, as shown in FIG. 1, insulating layer 20 may be deposited onto the surface of capacitor 10 and subsequently planarized using CMP. Conductive features such as plugs 22, 23, and 50 and lines 51–53 may be formed in accordance with the damascene, dual damascene, or deposition and etch methods described above. Preferably, for the damascene and dual damascene processes, the etchant used during feature 22, 23, 50 formation to remove material 20 etches material 20 at a rate greater than it etches plate 16 material, such that the etch does not punch through top plate 16 and attack dielectric 14, or to base plate 12 to create unwanted capacitor shorts. After features such as lines 51–53 are formed, the surface of layer 20 may be planarized to form the structure shown in FIG. 1.

In accordance with a preferred embodiment of the present invention, methods for forming capacitors 10 and the like are preferably chosen such that, if possible, minimal additional or new process steps are required to form the capacitors. Accordingly, the process flow sequence described for forming the structure shown in FIG. 1, including capacitor 10, preferably requires only a single additional patterning step in addition to typical damascene interconnect processes. The addition of only one additional masking step makes the addition of capacitor 10 to a microelectronic device relatively simple and inexpensive.

Figure 9:
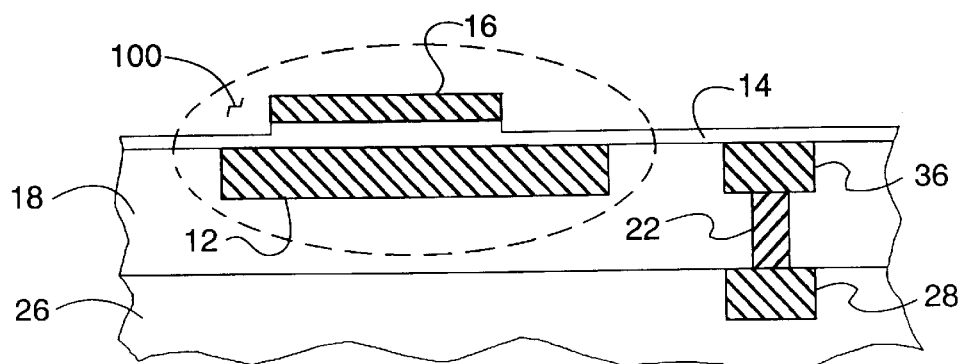
FIG. 9 is a schematic cross-sectional diagram of a thin-film capacitor on a surface of a semiconductor wafer in accordance with an alternate embodiment of the present invention.

In accordance with an alternate embodiment of the present invention and as shown in FIG. 9, a capacitor 100 may suitably be formed without the inclusion of spacers. Capacitor 100 may be advantageous because it requires fewer processing steps to form the device. However, capacitor 100 may be susceptible to potential chemical attack and resulting degradation due to subsequent processing steps.

Figure 10:
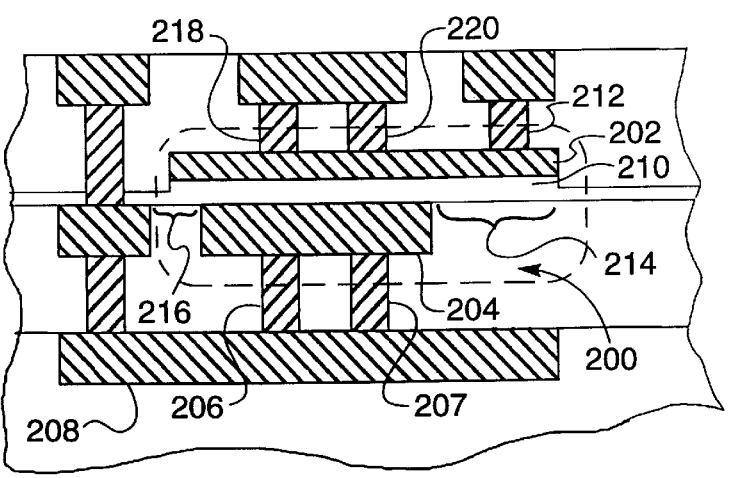
FIG. 10 is a schematic cross-sectional diagram of a wafer including a capacitor formed at an interior portion of the wafer in accordance with an alternate embodiment of the present invention.

In accordance with all alternate embodiment of the present invention and as shown in FIG. 10, a top plate 202 of a capacitor 200 may be larger in area than a base plate 204. In this case, an electrical connection to base plate 204 may be formed using the methods noted above, namely damascene and/or dual damascene processes. When top plate 202 overhangs base plate 204, connections to base plate 204 using conductive features such as plugs 206, 207 below base plate 204 to an underlying conductive feature such as line 208 are generally required. The "positive overhang" of top plate 202 may be particularly advantageous because it serves to, among other things, protect device layers such as a dielectric layer 210 and base plate 204 from damage during subsequent device fabrication steps.

In accordance with various aspects of the above embodiment, a plug 212 above top plate 202 may be positioned substantially in a region defined by the positive overhang regions 214, 216. This aspect of the present embodiment allows an etchant for via formation for plug 212 that is not particularly selective with respect to dielectric 210 or top plate 202 material to be employed for the via formation process. If the via etch is not selective, as the length of overhang 214 approaches zero, the chance of forming unwanted capacitor shorts between plates 202, 204 increases. Contrariwise, if a selective via etch is used, then plugs may be formed above top plate 202 in an area defined by bottom plate 204 (e.g., plugs 218 and 220).

Figure 11:
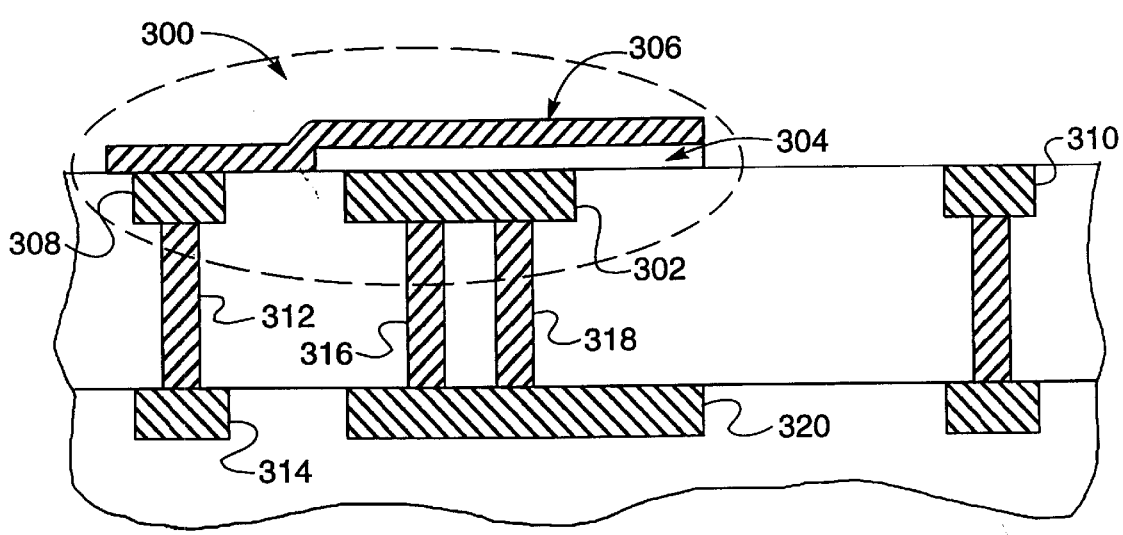
FIG. 11 is a schematic cross-sectional diagram of a wafer including a capacitor, having a top plate offset from a bottom plate, formed at an interior portion of the wafer in accordance with an alternate embodiment of the present invention.

Referring now to FIG. 11, in accordance with another embodiment of the present invention, a capacitor 300 may be formed in the top most metallization layers on the wafer surface. Forming capacitor 300 on the upper most layers may be advantageous because, among other reasons, parasitic capacitance between capacitor 300 and the substrate (e.g., semiconductor wafer) is reduced because of the increased distance between a base plate 302 and the substrate. This embodiment may be desirable in high frequency (e.g., RF) applications where parasitic capacitance is particularly problematic. Capacitor 300 formation may require additional masking and etching steps to form a capacitor dielectric structure 304 compared to the exemplary embodiments described above in connection with FIGS. 1–10. In particular, unlike the embodiments described above, layer 304 is preferably patterned and etched to remove all the dielectric material away from structure 304 to, among other things, expose conductive features such as lines 308, 310. Top plate 306 material is subsequently deposited and patterned such that electrical connections may be made to, for example, feature 308.

As shown in FIG. 11, electrical connection to top plate 306 may be formed beneath plate 306 using, line 308, a plug 312, and a line 314. Similarly, electrical connections to base plate 302 may be formed using conductive plugs 316, 318 and a line 320.

Figure 12:
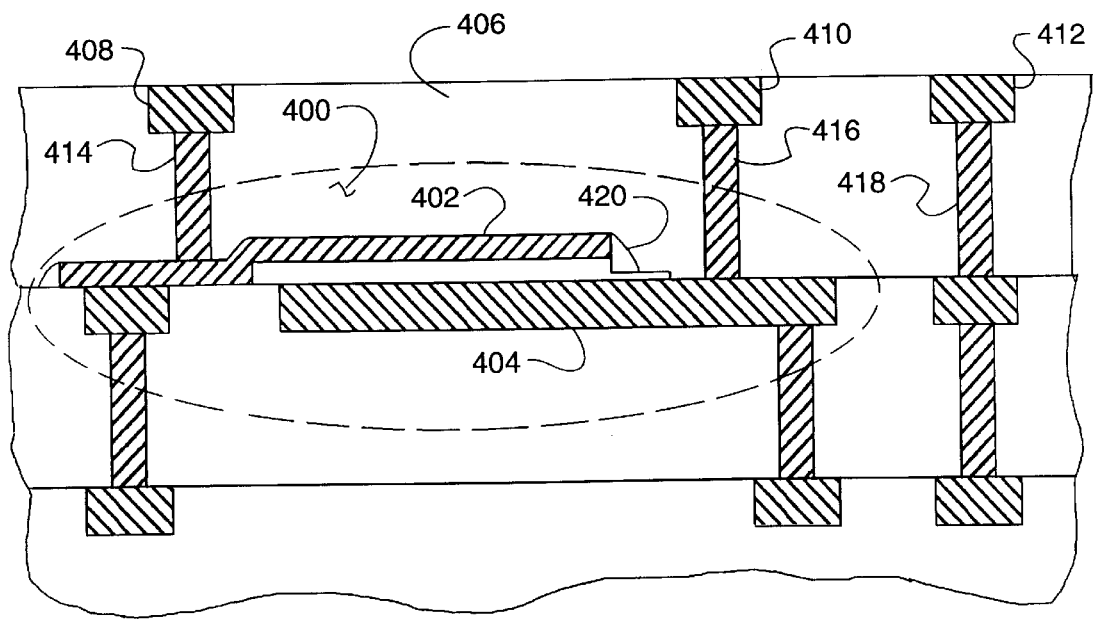
FIG. 12 is a schematic cross-sectional diagram of a wafer including a thin-film capacitor having a top plate offset from a bottom plate, in accordance with an alternate embodiment of the present invention.

Referring now to FIG. 12, a capacitor 400 with a top plate 402 offset from a bottom plate 404, in accordance with an alternate embodiment of the present invention, is shown. In accordance with an exemplary aspect of this embodiment, capacitor 400 is formed at an interior metallization level. In other words, devices including capacitor 400 may include additional insulating layers such as a layer 406 and conductive features such as lines 408, 410, and 412 and plugs 414, 416, and 418. Capacitor 400 may be formed using processes described above in connection with capacitor 300. The offset of top plate 402 allows for electrical connections to top plate 402 and bottom plate 404 to be formed from metallization levels which are either above or beneath the respective plates. Capacitor 400 may also include a spacer 420 as shown in FIG. 12, which may be formed using methods described above in connection with spacer 48 formation.

Figure 13:
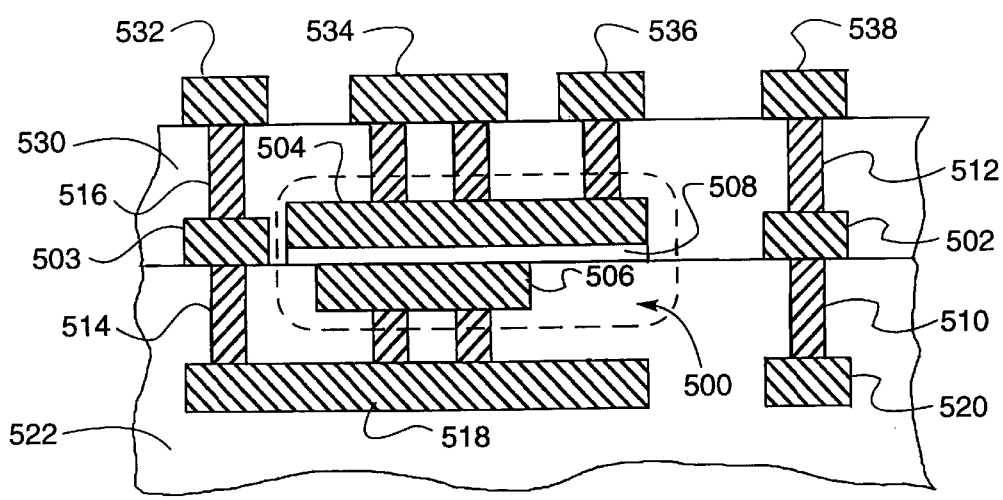
FIG. 13 is a schematic cross-sectional diagram of a wafer including a thin-film capacitor having a top plate overhanging a bottom plate in accordance with an alternate embodiment of the present invention.

In accordance with yet another embodiment of the present invention, as shown in FIG. 13, a capacitor 500 including various metal features such as lines 502 and 503 may be formed during the same process steps used to form a top plate 504. With this process, conductive features such as lines 502 and 503 may be formed using deposition and etch processes described above, and conductive plugs 510, 512, 514, and 516 may be formed using damascene processes (i.e., etch, fill, and planarize) processes described above. As described in more detail below, the method according to this embodiment of the present invention typically requires masking and etching steps to form a capacitor base plate 506 and a capacitor dielectric feature 508 in addition to those used to form other device features.

Figure 14:
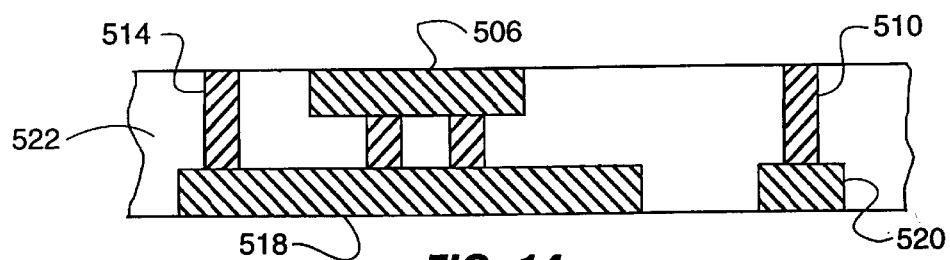
FIG. 14 is a schematic cross-sectional diagram showing a base plate formed within an insulating material.

Referring now to FIG. 14, conductive features such as lines 518 and 520 are formed using conventional deposition and etch processes. An interlayer dielectric material 522 is then deposited onto the wafer surface. Dielectric material may include any material resistant to the conduction of electricity, including insulating and dielectric materials described above in connection with other embodiments of the present invention. In accordance with an exemplary embodiment of the present invention, material 522 may be planarized to provide a smooth surface for subsequent processing. A bottom plate 506 of capacitor 500 may then be formed using damascene processing as described above. Note that the conductive features such as line 502 are not formed during base plate 506 formation, as was the case for the embodiment described in connection with FIG. 1.

Figure 15:
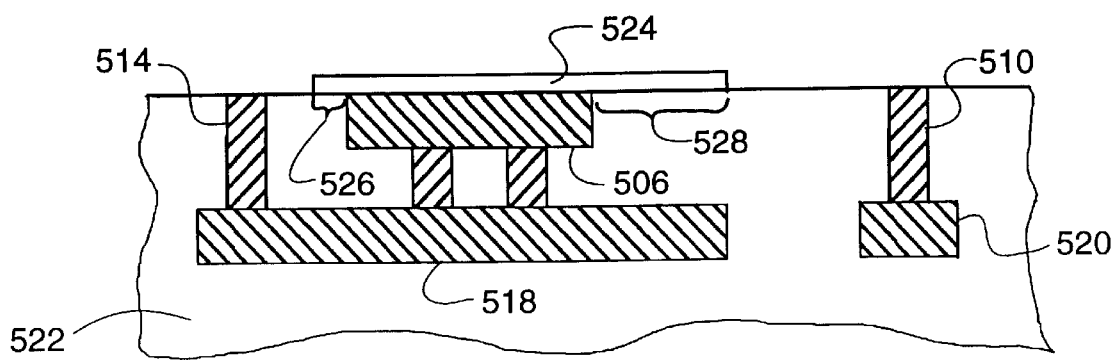
FIG. 15 is a schematic cross-sectional representation of the wafer shown in FIG. 14 with a dielectric structure formed thereon.

Referring now to FIG. 15, a dielectric structure 524 may be formed by depositing a dielectric material over the entire surface of the wafer. Dielectric material may include any material that is partially or wholly resistant to the conduction of electricity. Preferably, material used to form dielectric layer also has a high dielectric constant. Such materials may include silicon oxides, silicon nitrides, silicon oxynitrides, tantalum oxide, barium strontium titanate, or other high dielectric constant materials. As with previous embodiments of the present invention, the particular thickness of the dielectric layer may depend on a particular application of capacitor 500, upon desired capacitor 500 characteristics, and the like. After deposition, the dielectric material is patterned and etched to form structure 524. In accordance with an exemplary embodiment of the present invention, the patterning and etching processes are configured such that structure 524 extends beyond base plate 506, creating overhang regions 526, 528. Also, the patterning and etching processes are configured such that plugs 510, 514 are exposed. This allows an electrical connection to be formed to other conductive features (e.g., lines 502, 503) by subsequently depositing other layers of conductive material.

Figure 16:
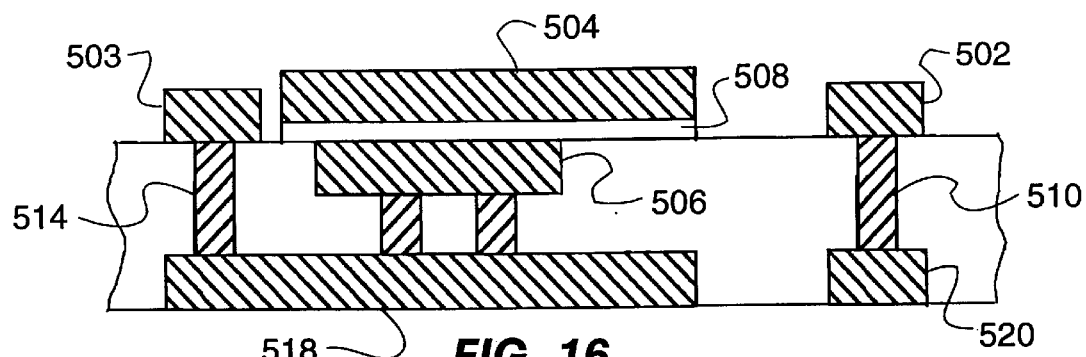
FIG. 16 is a schematic cross-sectional diagram of the wafer shown in FIG. 15 with the top plate of a capacitor formed thereon.

Referring now to FIG. 16, lines 502 and 503 and top plate 504 may be formed by depositing conductive material over the wafer surface, patterning the conductive material, and etching the material to form lines 502 and 503, plate 504, and the like. Overhang regions 526 and 528 allow for relatively aggressive etches to be used during top plate 504 formation because base plate 506 is shielded from such an etch by dielectric structure 524. During subsequent device process steps, other features such as plugs 512, 516 may be formed on the wafer surface. For example, dielectric material 530 may be deposited onto the wafer surface and, if desired, planarized. Material 530 may then be patterned and etched to form vias for plugs 512, 516 and the like. Subsequent conductive features such as lines 532, 534, 536, 538 and the like may then be formed by depositing a conductive material such as metal over the wafer surface and patterning and etching the conductive material to form features 532–538.

Figure 17:
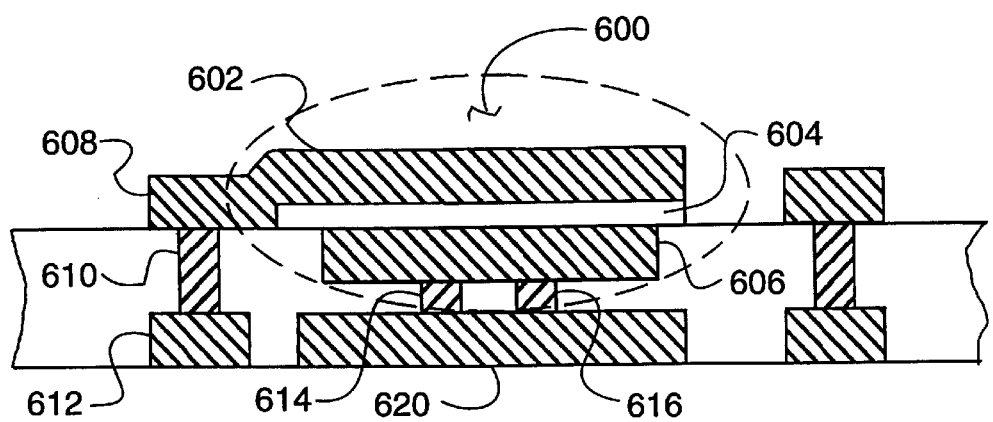
FIG. 17 is a schematic cross-sectional diagram of a wafer including a thin-film capacitor in accordance with an alternate embodiment of the present invention.

In accordance with another embodiment of the present invention, a device including a capacitor 600 may be configured such that a top plate 602 forms part of the top metallization level as shown in FIG. 17. As noted above in connection with various other embodiments, this embodiment may be particularly desirable in high frequency (e.g., RF) applications where parasitic capacitance is particularly problematic. Capacitor 600 suitably includes top plate 602, a dielectric structure 604, and a base plate 606.

As shown in FIG. 17, electrical connections between top plate 602 and other device components may be formed using, for example, a line 608, a plug 610, and a line 612. Similarly, base plate 606 may be electrically coupled to other device features using plugs 614, 616 and a line 620.

The terms top and bottom have been used throughout this application to refer to various layers, plates and surfaces. These terms are used for reference to the drawing figures only and are not meant to limit possible configuration of capacitors described hereinabove. In addition, although the present invention is set forth herein in the context of the appended drawing figures, it should be appreciated that the invention is not limited to the specific forms shown. Various other modifications, variations and enhancements in the design and arrangement of the thin-film capacitors as set forth herein may be made without departing from the spirit and scope of the present invention as set forth in the appended claims. For example, various feature or devices such as resistors, inductors and the like may be formed on a surface of a wafer during device or capacitor formation.

What is claimed is:

1. A method for forming a capacitor on a surface of a substrate, the method comprising:
   depositing a first insulating material on the surface of the substrate;
   forming a trench within said insulating material;
   depositing a first conductive material onto said first insulating material;
   removing a portion of said conductive material to form a base plate such that the top surface of said first conductive material and said first insulating material are substantially planar;
   forming an insulating layer over said conductive material; and
   forming a top plate of a capacitor, wherein said top plate is formed by depositing a second conductive material and etching said second conductive material such that at least a portion of said second conductive material resides over said insulating layer.

2. The method for forming a capacitor on a surface of a substrate of claim 1, the method further comprising the step of forming a via within said first insulating material.

3. The method for forming a capacitor on a surface of a substrate of claim 2, the method further comprising the step of forming a conductive plug within said via.

4. The method for forming a capacitor on a surface of a substrate of claim 1, the method further comprising the step of forming an electrical connection between said substrate and said base plate.

5. The method for forming a capacitor on a surface of a substrate of claim 1, the method further comprising forming an electrical contact to said top plate of said capacitor.

6. The method for forming a capacitor on a surface of a substrate of claim 1, the method further comprising forming a spacer about a perimeter of said capacitor.

7. A method of forming a thin-film capacitor, the method comprising the steps of:
   forming a first insulating layer on a surface of a substrate;
   forming a trench within said first insulating layer;
   depositing a first conductive material onto said first insulating material;
   removing a portion of said conductive material to form a base plate such that the top surface of said first conductive material and said first insulating layer are substantially planar;
   forming a dielectric layer over said conductive material, said dielectric layer in contact with said first insulating layer;

forming a top plate of a capacitor, wherein said top plate is formed by depositing a second conductive material and etching said second conductive material such that at least a portion of said second conductive material resides over said insulating layer; and forming a conductive feature through a portion of said dielectric layer.

8. The method of claim 7, further comprising the step of forming a spacer about a portion of said dielectric layer and said top plate.

9. The method of claim 7, further comprising the step of forming a conductive feature within said first insulating layer.

10. The method of claim 7, further comprising the step of forming a second insulating layer overlying said first insulating layer.

11. The method of claim 10, further comprising the step of forming a conductive feature within said second insulating layer.

12. A method of forming a microelectronic capacitor, the method comprising the steps of:

forming a first insulating layer on a surface of a substrate;

forming a trench within said first insulating layer;

depositing a first conductive material onto said first insulating material;

removing a portion of said conductive material to form a base plate such that the top surface of said first conductive and said first insulating layer are substantially planar;

forming a dielectric structure overlying said base plate and in contact with said first insulating material; and forming a top plate of the capacitor, said top plate in contact with said first insulating layer and said dielectric structure.

13. The method of claim 12, further comprising the step of forming a spacer about a perimeter of said dielectric structure.

* * * * *